United States Patent
Castor-Perry

(10) Patent No.: US 8,767,867 B1
(45) Date of Patent: Jul. 1, 2014

(54) INTEGRATED CONTROL OF POWER SUPPLY AND POWER LINE COMMUNICATIONS

(71) Applicant: Kendall Castor-Perry, San Diego, CA (US)

(72) Inventor: Kendall Castor-Perry, San Diego, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 13/783,954

(22) Filed: Mar. 4, 2013

Related U.S. Application Data

(60) Provisional application No. 61/647,673, filed on May 16, 2012.

(51) Int. Cl.
H04L 27/00 (2006.01)
H02M 3/335 (2006.01)

(52) U.S. Cl.
USPC .................................. 375/295; 363/21.1

(58) Field of Classification Search
USPC ......... 375/130, 259, 271, 272, 295, 316, 257, 375/258, 285; 363/21.1; 340/12.32
See application file for complete search history.

(56) References Cited

U.S. PATENT DOCUMENTS

| | | | |
|---|---|---|---|
| 6,151,225 A * | 11/2000 | Ho et al. | 363/21.09 |
| 7,183,900 B2 * | 2/2007 | Sullivan | 370/488 |
| 8,045,348 B2 * | 10/2011 | Zhu et al. | 363/49 |
| 8,208,518 B2 | 6/2012 | Cappelletti et al. | |
| 8,330,303 B2 | 12/2012 | Lanni | |
| 2003/0218549 A1 | 11/2003 | Logvinov et al. | |
| 2005/0030912 A1 | 2/2005 | Logvinov et al. | |
| 2006/0181601 A1 * | 8/2006 | Seo | 347/223 |
| 2007/0160081 A1 | 7/2007 | Logvinov et al. | |
| 2007/0202839 A1 * | 8/2007 | Abraham et al. | 455/402 |
| 2012/0031478 A1 | 2/2012 | Boisvert et al. | |

FOREIGN PATENT DOCUMENTS

EP 2400668 A 12/2011
GB 2088655 A * 6/1982 ............ H02M 7/537

OTHER PUBLICATIONS

Atmel Power Line Communications Solutions for the Smart Grid, 2012, 8 pages.
Ganesh_Netgear Selects Broadcom HPAV Solution for Powerline Products; Jan. 6, 2013; 3 pages.
S-FSK Power Line Networking System-On-Chip Datasheet, Sep. 2012; 26 pages.

* cited by examiner

Primary Examiner — Vineeta Panwalkar

(57) ABSTRACT

Apparatuses and methods of integrating power supply unit (PSU) control and power line communication (PLC) to transmit data on a power line in a transmitting node. One method modulates a switching frequency of the PSU between multiple spread frequencies to transmit the data.

20 Claims, 9 Drawing Sheets

INTEGRATED CONTROL OF POWER SUPPLY AND POWER LINE COMMUNICATIONS

RELATED APPLICATIONS

This application also claims the benefit of U.S. Provisional Application No. 61/647,673, filed May 16, 2012, the entire contents of which is hereby incorporated by reference.

TECHNICAL FIELD

The present disclosure relates generally to power line communication (PLC), and more particularly to systems with integrated power control and PLC.

BACKGROUND

Power line communications (PLC) carry data on a conductor that is also used simultaneously for alternating current (AC) electrical power transmission (electric power distribution) to consumers. PLC can also be used on direct current (DC) systems, such as vehicle power, solar cell systems, or the like. PLC is sometimes also known as power line carrier, power line digital subscriber line (PDSL), mains communications, power line telecom (PLT), power line networking (PLN) and broadband over power lines (BPL). AC electrical power supply is also referred to as mains electricity, household power, household electricity, house current, powerline, domestic power, wall power, line power, AC power, city power, street power, and grid power. PLC systems typically operate by impressing a modulated carrier signal on the wiring system. Different types of PLC systems use different frequency bands, depending on the signal transmission characteristics of the power wiring used. Since the power distribution system was originally intended for transmission of AC power at typical frequencies of 50 or 60 Hz, some power wire circuits may have a limited ability to carry higher frequencies.

A switched-mode power supply (SMPS), also referred to as switching-mode power supply or switcher, is an electronic power supply that incorporates a switching regulator to convert electrical power efficiently. Like other power supplies, an SMPS transfers power from a source, like mains power, to a load, such as a personal computer, while converting voltage and current characteristics. An SMPS is usually employed to efficiently provide a regulated output voltage, typically at a level different from the input voltage. The pass transistor of a switching-mode supply continually switches between low-dissipation, full-on and full-off states, and spends very little time in the high dissipation transitions, which may minimize wasted energy. Ideally, a switched-mode power supply dissipates no power. Voltage regulation is typically achieved by varying the ratio of on-to-off time.

Typically, a power line modem (PLM) is used for communications over power lines. Like ordinary modems, a PLM is able to convert a binary data stream into a sequence of signals with predefined characteristics, such as frequency, levels, etc.), and vice-versa, the PLM is able to convert a sequence of signals back to a binary data stream.

The noise created by switching power supplies can cause problems for simple power line communications schemes. This is a particular problem in equipment that contains a SMPS and communicates using PLC over the same power connection.

Many switching power supplies make use of high frequency energy in the region of 50 kHz~200 kHz. Power line modems also may use the same frequency range for PLC transmissions. When a piece of equipment uses both a SMPS and a power line modem, coexistence is a problem due to interference. This interference may occur both locally and between devices joined by a common power connection. Conventional solutions separate the power supply unit (PSU) block and the PLC block and isolate these blocks using suitable filtering to reduce the noise created by switching power supplies.

BRIEF DESCRIPTION OF THE DRAWINGS

The present invention is illustrated by way of example, and not of limitation, in the figures of the accompanying drawings in which.

DETAILED DESCRIPTION

Figure 1:
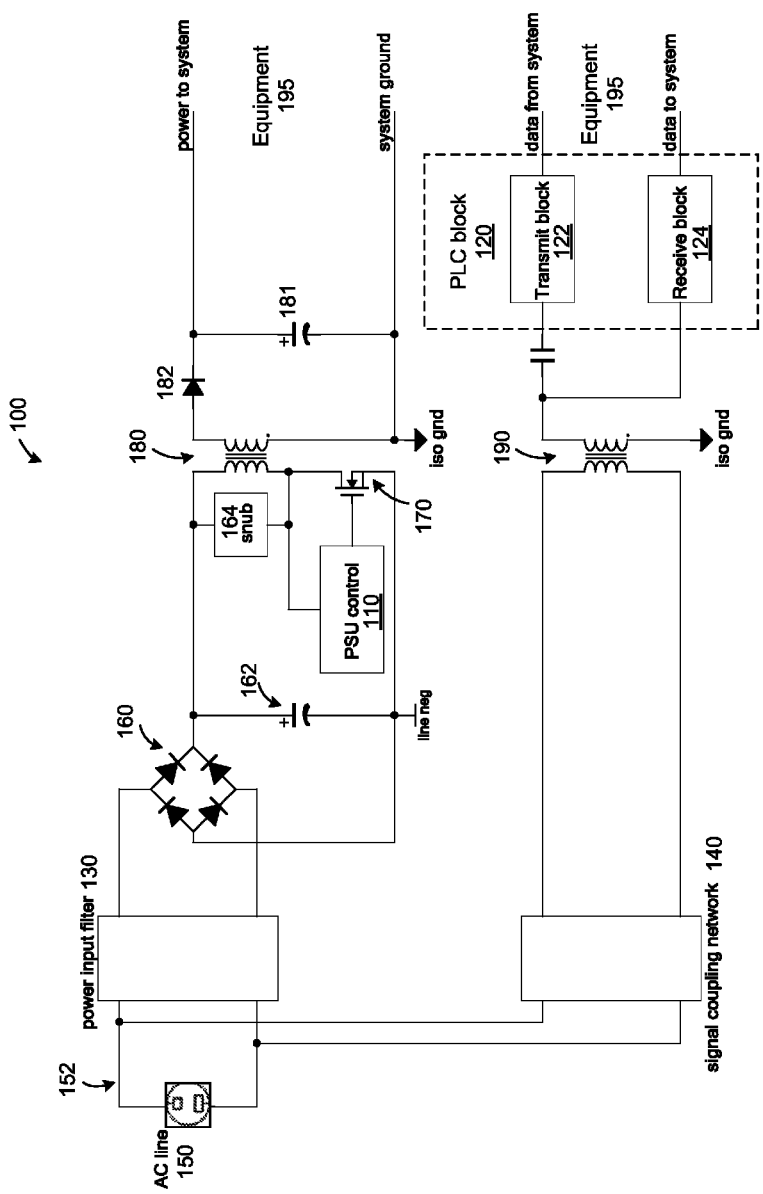
FIG. 1 is a block diagram illustrating a typical non-integrated system that includes a power controller on an AC line side and a separate power line communication (PLC) circuit isolated from the AC line.

In the following description, for purposes of explanation, numerous specific details are set forth in order to provide a thorough understanding of the present invention. It will be evident, however, to one skilled in the art that the present invention may be practiced without these specific details. In other instances, well-known circuits, structures, and techniques are not shown in detail, but rather in a block diagram in order to avoid unnecessarily obscuring an understanding of this description.

Reference in the description to "one embodiment" or "an embodiment" means that a particular feature, structure, or characteristic described in connection with the embodiment is included in at least one embodiment of the invention. The phrase "in one embodiment" located in various places in this description does not necessarily refer to the same embodiment.

As described above, noise created by switching power supplies can cause problems for simple power line communications schemes for equipment that contain PSUs and communicate using PLC over the same power connection. Not only may one equipment's PSU interfere with itself, but other equipment connected to that equipment can interfere as well. The conventional solutions utilize separate blocks for the PSU control and the PLC. Separate PLC circuitry, as done conventionally, represents an additional cost (particularly on the transmit side) and can also suffer badly from interference created by the adjacent power supply.

The embodiments described herein integrate the PSU control scheme and the PLC modulation method so that reliable bi-directional PLC can be achieved in an operating unit. The ability of the PSU to inject a signal onto the power connection, which is normally unwanted, may be directly exploited to create the PLC transmit signal. The embodiments described herein combine the power supply control and the power line modem control. The power supply itself generates the PLC transmit signal when needed, and the PLC receiver is designed to be resistant to the power supply's switching frequency when the system is not transmitting data. As a result, the interference problem may be managed away by the integrated design. The integrated power control and PLC can be implemented in a PLC-integrated SMPS. Alternatively, the power control circuit (also referred to as PSU block) and PLC circuit can be integrated on a common carrier substrate in other configurations as would be appreciated by one of ordinary skill in the art having the benefit of this disclosure.

In one embodiment, the PLC-integrated SMPS exploits controlled propagation (e.g., leakage) of the switching noise of a switched-mode PSU as a deliberate transmitter of intentional signals carrying power line communications. The switching noise may be a signal that arises on the power supply input terminals as a result of the switching frequency of the power supply. Under non-transmission conditions, the power supply idles at a first, substantially fixed switching frequency (referred to as idle frequency). The switching frequency is a known frequency. The first frequency may be locked to the AC line frequency so that no high-precision timing component is required, and possibly slightly spread in spectrum to reduce peak levels. When the unit transmits, the switching frequency is modulated between two different frequencies, one higher than and one lower than the idle frequency, so that the mean frequency is unchanged. The modulation is treated as spread frequency-shift keying (S-FSK) and is demodulated as such by a remote receiver. The S-FSK receiver is designed to be immune to large amounts of the idle frequency present. Thus, a link can be established between nodes by the simple expedient of modulating the local power supply idle frequency; no separate PLC transmit electronics is needed.

The PLC-integrated SMPS may provide improved performance of a network of such systems. Aside from potentially improved performance from a network of such systems, the combination of both these functions into a single circuit may reduce cost and board area. Both of these are valuable commodities in modern equipment that utilize switching power supplies and PLC, such as small networked appliances. Modern line-powered equipment (e.g. networked LED light bulbs, server power supplies) may require an effective power line communication means that can coexist with a built-in power supply of economical design.

The close integration of power supply and communications technologies in a single device makes economic sense and can also facilitate desirable additional capabilities that will improve the extended systems into which these components, and products containing them, are designed. Also, by creating the PLC transmit signal directly from the PSU, a coverage area of a typical PLC network may be increased.

FIG. 1 is a block diagram illustrating a typical non-integrated system 100 that includes a power controller 110 on an AC line side and a separate power line communication (PLC) circuit 120 isolated from the AC line 150. The power controller 110 and the PLC circuit 120 are independently operating. The power controller 110 may be a power switching unit (PSU) control block that switches a power transistor 170 (e.g., MOSFET transistor) according to a specified duty cycle as described herein. The power transistor 170 may be on-board power transistor or may be external to the integrated circuit. That is, the PSU control block can be configured to control a power transistor that is not integrated into the same IC as the PSU control block. Independently, the data communications between the equipment 195 and any remote locations connected to the AC power line 150 is established through a separate small-signal transformer 190 that serves as a bidirectional connection. The signal coupling network 140 ensure that only the desired carrier frequencies pass out the transmit path and passed into the receive path. The PLC block 120 includes a transmit block 122 to transmit data from the equipment 195 on the transmit path and a receive block 124 to receive data for the equipment 195 on the receive path. In this implementation, the PSU control 110 is located on the AC line side and the load is isolated from the AC line via a transformer 180. A bridge rectifier 160 is coupled to the AC lines and a power input filter 130 may be located between the AC lines 150 and the bridge rectifier 160. The power input filter 130 may be used for filtering electronic noise at the input terminals 152. For example, the power input filter 130 can be used for electromagnetic interference (EMI) filtering (also referred to as radio frequency interference (RFI)). The bridge rectifier 160 is used for conversion of the AC input into a direct current (DC) output. The bridge rectifier 160 may provide full-wave rectification from a two-wire AC input. A capacitor 162 (smoothing capacitor or reservoir capacitor) can be disposed on the output of the bridge rectifier 160 to lessen the variation (commonly referred to as smoothing) the rectified AC output voltage waveform from the bridge rectifier 160. A snubber circuit 164 (e.g., resistor-capacitor-diode (RCD) snubber circuit) may be used to clamp excess voltage on the drain of the MOSFET transistor 170. A flyback converter is a simple topology that can be used to replace filter inductors with coupled inductors, such as gapped core transformers. When the main switch turns on, the energy is stored in the transformer as a flux form and is transferred to output during the main switch off-time. Since the transformer needs to store energy during the main switch on-time, the core should be gapped. When the voltage (Vds) exceeds the input voltage, there is a resonance between the leakage inductor of the main transformer 180 and the output capacitors of the power transistor 170. The snubber 164 can protect the main switch. The snubber circuit 164 can absorb the current in the leakage inductor by turning on a snubber diode. On the load side of the transformer 180, there is a capacitor 181 and a diode 182 that convert the AC output from the transformer secondary (180) into DC for the system (equipment 195).

The PSU control 110 controls a power transistor 170 using duty cycle control. The power transistor 170 is switched fully on or fully off so there are very little resistive losses between the input and the load. The PSU control 110 switches large currents at high frequencies. However, the close proximity of the power supply to the PLC block 120 cannot be ignored. The power supply is switching large currents, at high frequencies that may not be dissimilar from the signaling frequencies used by the PLC block 120. Different PLC technologies are sensitive to this interference in differing ways. The standard FSK method of PLC can be significantly compromised by frequencies over quite a wide range if they are sufficiently high in level, as they are bound to be in a compact design, such as a light bulb.

In FIG. 1, the PSU control 110 is on the AC line, referred to as "hot power" and the PLC circuit 120 is on the load side and isolated from the AC line, referred to as "isolated PLC." There are other configurations for non-integrated systems where the PSU control and the PLC circuit are separate blocks. For example, the PSU control 110 and the PLC circuit 120 are located on the AC line side for "hot power" and "hot PLC" configuration. In this embodiment, the equipment 195 can be isolated from the AC line side by a transformer (like transformer 180), and the PLC circuit 120 can be isolated with opto-isolators. Opto-isolators, also called optocoupler, photocoupler, or optical isolator, is an electronic device designed to transfer electrical signals by utilizing light waves to provide coupling with electrical isolation between its input and output. Opto-isolators can be used to prevent high voltages or rapidly changing voltage on the isolated side from damaging components or distorting transmissions. In one implementation, the data sent from the system is passed through a first opto-isolator to the transmit block 122 and the data received by the system is received through a second opto-isolator from the receive block 124. In effect, the opto-isolators send from and receive logic level signals from the equipment 195, isolating the equipment 195 from the AC line 150. In another embodiment, the PSU control 110 is on the load side that is isolated from the AC line 150 and the PLC circuit 120 is also isolated from the AC line 150 in an "isolated power" and "isolated PLC" configuration. For example, the PSU control 110 and PLC circuit 120 can be isolated with two transformers 180 and 190 illustrated in FIG. 1, as well as another transformer between the PSU control block 110 on the load side to the power transistor 170 on the AC line side. In another embodiment, the load is not isolated from the AC line at all. This embodiment may be similar to the configuration of FIG. 1, except the PSU control 110 is connected directly to the power to the system and there is no transformer 190 that isolates the PLC circuit 120 from the AC line 150.

Figure 2:
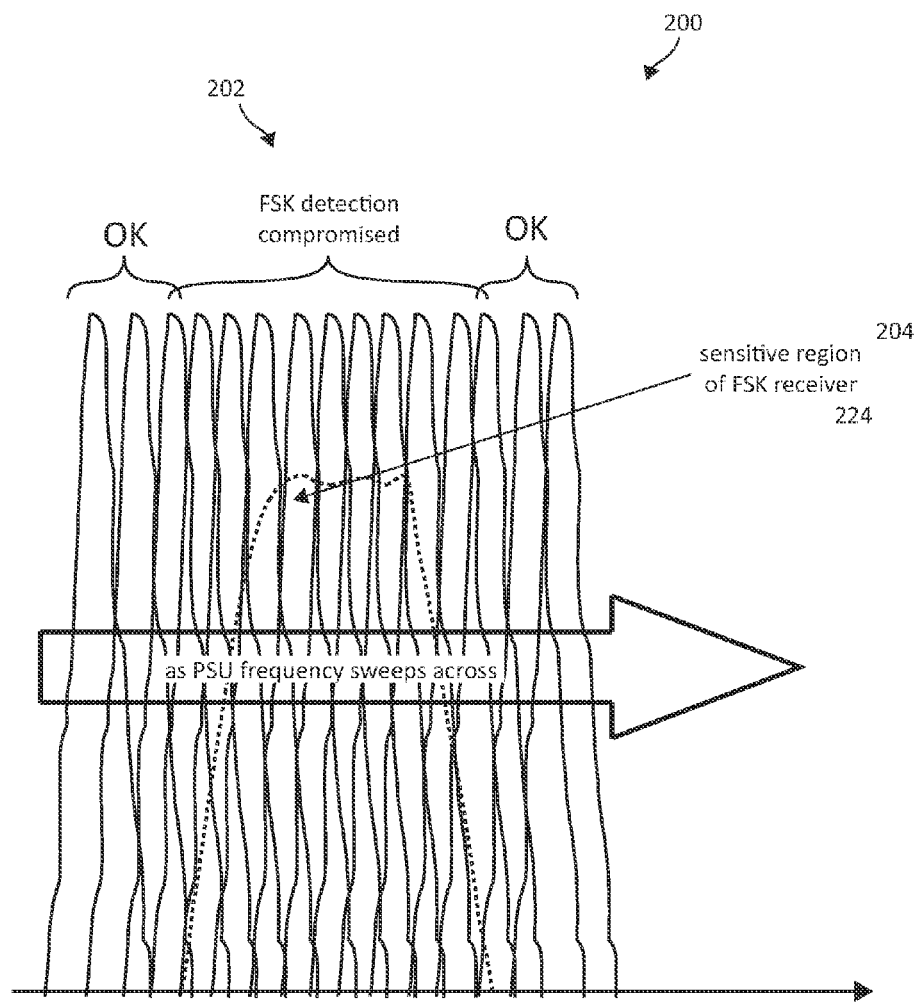
FIG. 2 is a frequency spectrum at the input of a standard FSK PLC receiver in a non-integrated system according to one embodiment.

FIG. 2 is a frequency spectrum 200 at the input of a standard FSK PLC receiver 224 in a non-integrated system according to one embodiment. The FSK PLC receiver 224 is separate from the PSU control block described above. The switching of the power supply causes narrowband interference tracking across the FSK PLC receiver 224. In effect, this interference comprises FSK detection over a wide range 202 of frequencies as the PSU sweeps across those frequencies. As shown in FIG. 2, this wide range 202 affects a sensitive region 204 of the FSK PLC receiver 224.

A PLC technique, such as S-FSK, should be quite resistant to the power supply interference, though performance may not be optimal if the operating frequency of the power supply falls within one of the sensitive frequency bands of the S-FSK receiver. The wider is the frequency range of operation of the power supply, the less predictable the results may be, since either (but not both) of the S-FSK detection bands might be compromised, as illustrated in FIG. 3.

Figure 3:
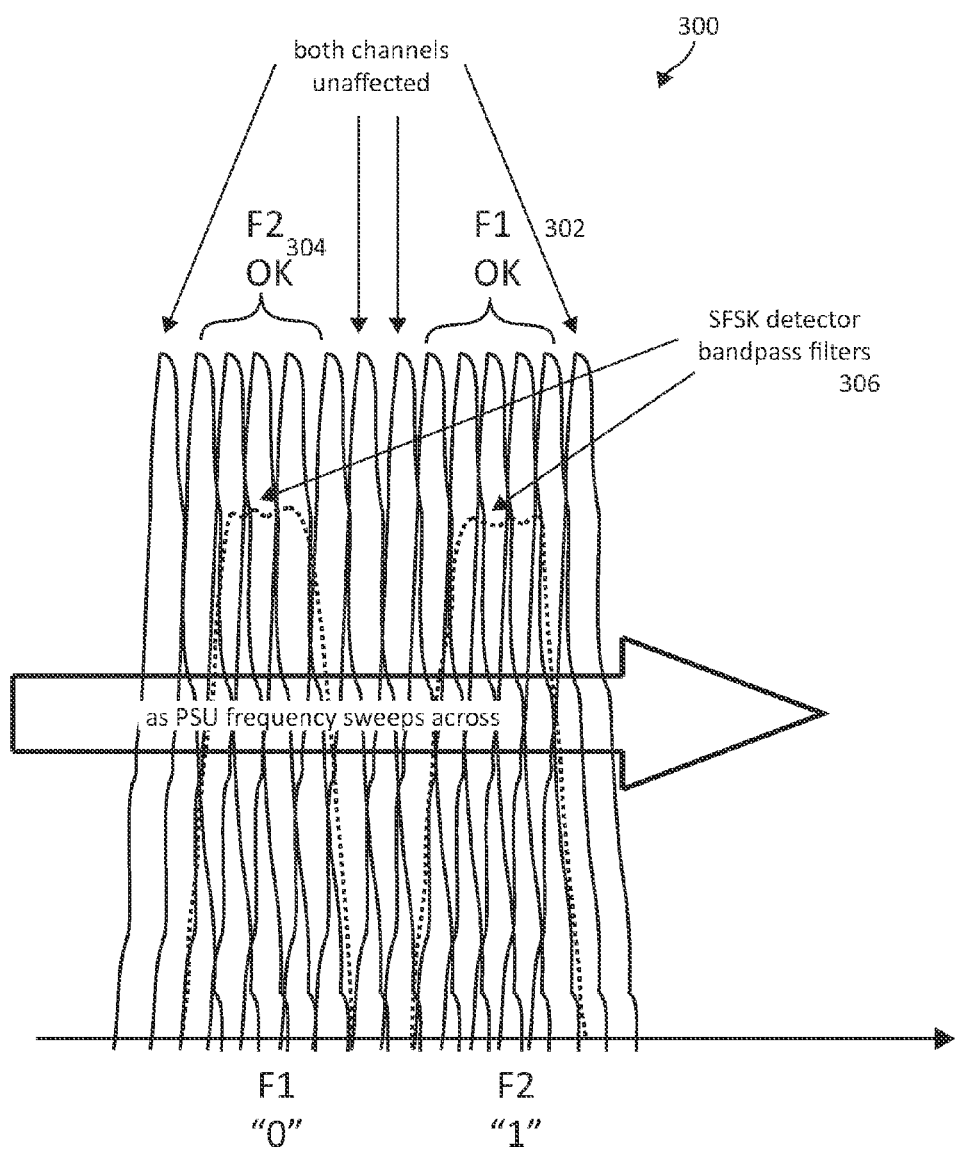
FIG. 3 is a frequency spectrum at the input of narrowband PSU interference across a spread frequency-shift keying (S-FSK) receiver according to one embodiment.

FIG. 3 is a frequency spectrum 300 at the input of narrowband PSU interference across an S-FSK receiver according to one embodiment. A spread-spectrum power supply spreads its radiated energy out over a wide range. The S-FSK receiver has two channels 302 (F1) and 304 (F2). The spread-spectrum power supply may degrade both channels 302,304 of an S-FSK system at the same time, though usually in a less critical way. When used in a PLC system, S-FSK is quite resistant to narrow-band interference, such as from PSUs, when compared to the older FSK method. The S-FSK system can have S-FSK detector band-pass filters 306. Narrow-band interference might reduce the available signal-to-noise (SNR) in one of the two S-FSK carrier bands 302,304, but it does not affect both of them at the same time. Even if affecting both channels at the same time, the energy density in each channel is lower and is less likely to impair either channel. It can therefore be seen that the interactions between the choices for power supply and PLC physical layer are quite complex.

Figure 4:
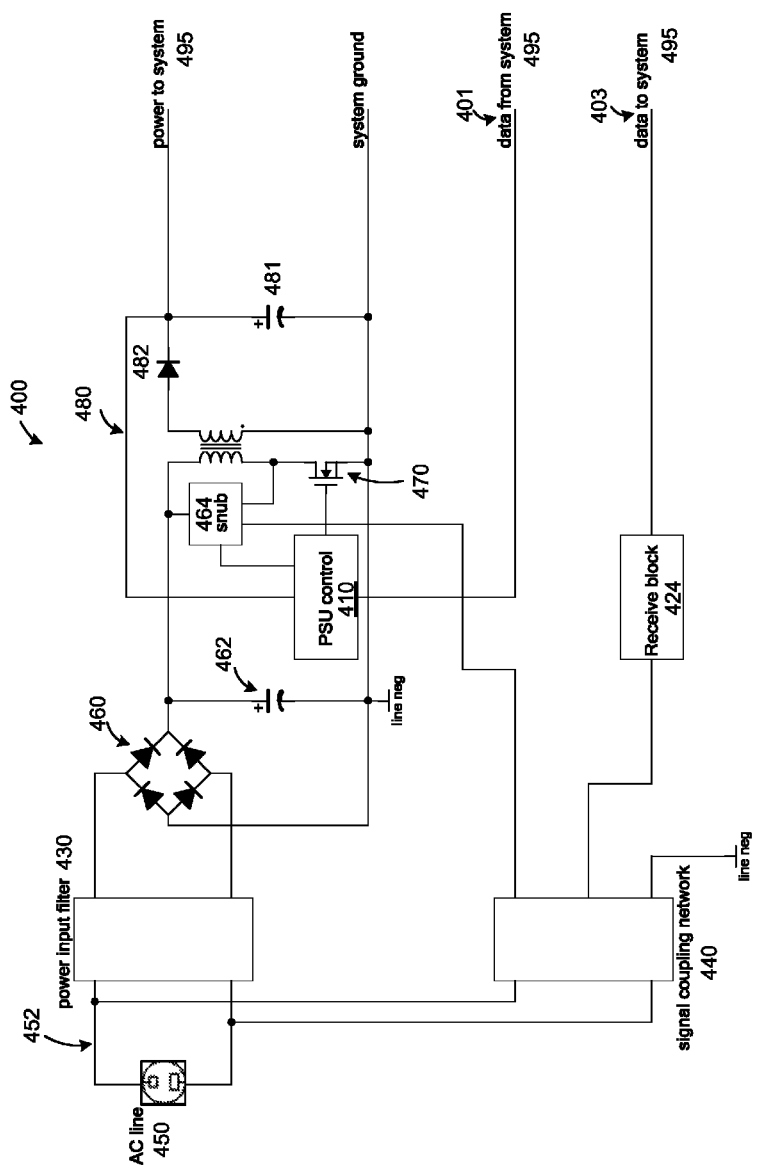
FIG. 4 is a block diagram illustrating a PLC-integrated SMPS that is not isolated from the AC line according to one embodiment.

FIG. 4 is a block diagram illustrating a PLC-integrated SMPS 400 that is not isolated from the AC line according to one embodiment. Instead of separate PSU control and PLC circuit as described above with respect to FIG. 1, the PLC-integrated SMPS 400 includes a PSU control block 410 that integrates PLC and power switching control. The PSU control block 410 switches a power transistor 470 according to a specified duty cycle as described herein. The power supply itself generates the PLC transmit signal when needed, and the PLC receiver (receiver block 424) is guaranteed to be resistant to the power supply's switching frequency. As a result, the interference problem may be managed away by the PLC-integrated design. In particular, data 410 from the system 495 (e.g., equipment) is input into the PSU control block 410. The PSU control 410 modulates the data 401 on the power line. In this embodiment, the modulated data is output via the signal coupling network 440 onto the AC line 450. The data communications between the system 495 and any remote location connected to the AC power line 450 is established without a separate small-signal transformer (transformer 190) to serve as a bidirectional connection. Rather, the receive block 424 can receive incoming communications on the AC line 450 with a single coupling network 440 that ensure that only the desired carrier frequencies pass into the receive path. The receive block 424 can be integrated into the same circuit (e.g., common carrier substrate or same circuit board) as the PSU control 410, and there is no need for a separate PLC circuit with a transmit block and a receive block because the PLC transmission is performed by the PSU control block 410 as described herein. In this implementation, the PSU control 410 is located on the AC line side and the load is isolated from the AC line via a transformer 480. A bridge rectifier 460 is coupled to the AC line 450 and a power input filter 430 may be located between the AC lines 450 and the bridge rectifier 460. The power input filter 430 may be used for filtering electronic noise at the input terminals 452. For example, the power input filter 430 can be used for EMI. The bridge rectifier 460 is used for conversion of the AC input into a DC output. The bridge rectifier 460 may provide full-wave rectification from a two-wire AC input. A smoothing capacitor 462 can be disposed on the output of the bridge rectifier 460 to lessen the variation or to smooth the rectified AC output voltage waveform from the bridge rectifier 460. A snubber circuit 464 (e.g., resistor-capacitor-diode (RCD) snubber circuit) may be used to clamp excess voltage on the drain of the MOSFET transistor 470. On the load side of the transformer 480, there is a capacitor 481 and a diode 482 that convert the AC output from the transformer secondary (480) into DC for the system 495.

It should be noted that the bridge rectifier 460 at the input terminal 452 converts the AC on AC line 450 to a DC feed for the power supply. The bridge rectifier 460 contains two pairs of diodes. Each pair conducts alternately during successive half-cycles of the line AC waveform. The conducting pair represent a low impedance path from the internal circuitry to the power line, and it must be possible to exploit this path for the entry and exit of PLC-relevant signals. Some factors to be taken into account for the bridge rectifier 460 may include the following: 1) The impedance of the conducting diodes should be significantly lower than the impedance of the capacitance (inherent or added) across the non-conducting pair. If the impedance is not significantly lower, the bridge topology of the supply connection could significantly reduce the level of incoming PLC signal. 2) The diodes should be selected to not create such high noise when they switch off that the input circuitry of the receiver is 'drowned out' by the switching of the diodes. 3) The alternating direction of the current means that the apparent polarity of the PLC signal is modulated at twice the line frequency. This would need to be taken into account if a phase-sensitive modulation scheme is used.

The PSU control 410 controls a power transistor 470 using duty cycle control. The power transistor 470 is switched fully on or fully off so there are very little resistive losses between the input and the load. The PSU control 410 switches large currents at high frequencies using a PLC modulation method such as S-FSK, as described in more detail below. The PLC-integrated SMPS 400 exploits controlled leakage of the switching noise of a switched-mode PSU 410 as a deliberate transmitter of intentional signals carrying power line communications. Under non-transmission conditions, the PSU control 410 idles at a fixed, known frequency. The PSU control 410 may idle at a substantially fixed frequency that is locked to the AC line frequency so that no high-precision timing component is required, and possibly slightly spread in spectrum to reduce peak levels. When the PSU control 410 transmits data 401, the supply frequency is modulated between two different frequencies—one higher than the idle frequency and one lower than the idle frequency, so that the mean frequency is unchanged. The modulation may be treated as spread frequency-shift keying (S-FSK) and is demodulated as such by a remote receiver (receiver block 424 of another system connected on the AC line 450). The S-FSK receiver is designed to be immune to large amounts of the idle frequency present. Thus, a link can be established between nodes by the simple expedient of modulating the local power supply idle frequency and no separate PLC transmit electronics is needed.

In one embodiment, the power supply for the end equipment under question is designed using a standard fixed frequency topology. The nominal operating frequency is set accurately to a desired value F0 by a suitable means. For example, the desired value F0 can be locked to the AC line frequency. This may be a low-cost approach since it does not need a crystal or resonator for the operating frequency F0. The desired value for the operating frequency F0 is positioned between two other frequencies F1 and F2, which may also be accurately defined and locked. The other frequencies F1 and F2 may be used as the higher and lower carrier frequencies of an S-FSK (spread FSK) PLC system.

As described herein, the power supply's own ability to inject a signal onto the power line is exploited to implement outgoing PLC communications. During transmission, instead of running at the substantially fixed frequency F0, the power supply operating frequency is modulated between frequencies F1 and F2. These frequencies are positioned so that F0 is their arithmetic mean, in other words, 2*F0=F1+F2. This property ensures that the number of transitions per second in the clock sent to the power supply is the same in the modulated and un-modulated states, provided that the input data has an equal long term 1s and 0s count. This in turn ensures that there is no zeroth-order impact of the data modulation on the energy transfer behavior of the power supply and therefore on its output voltage regulation.

It should be noted that filtering in a switched-mode power supply is normally designed to vigorously block both the fundamental and harmonic components of supply switching. In this scheme, it is necessary to 'impair' the input filtering in a controlled way, in order to allow the action of the power supply to be externally visible in the desired manner. If this 'impairment' can economically be engaged and disengaged as required, it will be advantageous, because full filtering during listen and receive states reduce the amount of F0 signal thrown out onto the line, improving overall system SNR. In one embodiment, the PSU control 410 can be configured to engage and disengage input filtering by the signal coupling network 440. In another embodiment, other mechanisms may be used to selectively filter the input to detect modulated signals on the power line. In another embodiment, the PSU control 410 can be configured to engage and disengage a connection between the snubber circuit and a signal coupling network.

Incoming PLC communications include a signal that is also modulated between frequencies F1 and F2. The receiver block 424 may include a receiver including an internal S-FSK decoder. The internal S-FSK decoder may be designed to be particularly resistant to interference at F0, and at harmonics of the line frequency resulting from the action of the main input bridge rectifier 460, through which all power and communications must pass. So the modulation carrying the desired data 403 can be detected by the receive block 424 in the equipment even when its own power supply is operating at, and radiating significant interference at, the frequency of F0. This is possible because all frequencies are known accurately by the receive block 424. The operations of the PSU control block 410 and the receiver 424 are described in more detail below with respect to FIGS. 6-7.

In the depicted embodiment of FIG. 4, the load is not isolated from the AC line at all. That is the PSU control 110 is coupled directly to the power of the system 495 and the receive block 424 is coupled directly to the system 495 without the receive block 424 of the system 495 being isolated from the AC line 450. In another embodiment, the PSU control 410 may be isolated from the AC line 450 as illustrated and described with respect to FIG. 5. In another embodiment, the digital signals received and sent to the system 495 (e.g., the equipment) can be isolated from the AC line 450. For example, in one embodiment, an opto-isolator can be located between the PSU control 410 and the system 495 for transmitting data 401 and another opto-isolator may be located between the receive block 424 and the system 495 for receiving the data on the AC line 450. In this embodiment, the intelligence of the PSU control 410 and the receive block 424 are on the AC line side, but the digital signals to and from these circuits are isolated. Alternatively, only one opto-isolator is used on either the transmit path or the receive path. It should also be noted that the opto-isolators are one technique for isolating digital signal lines of the equipment from the AC line 450. In another embodiment, other isolation mechanisms can be used to isolate the digital signals being sent from and received by the system 495.

Figure 5:
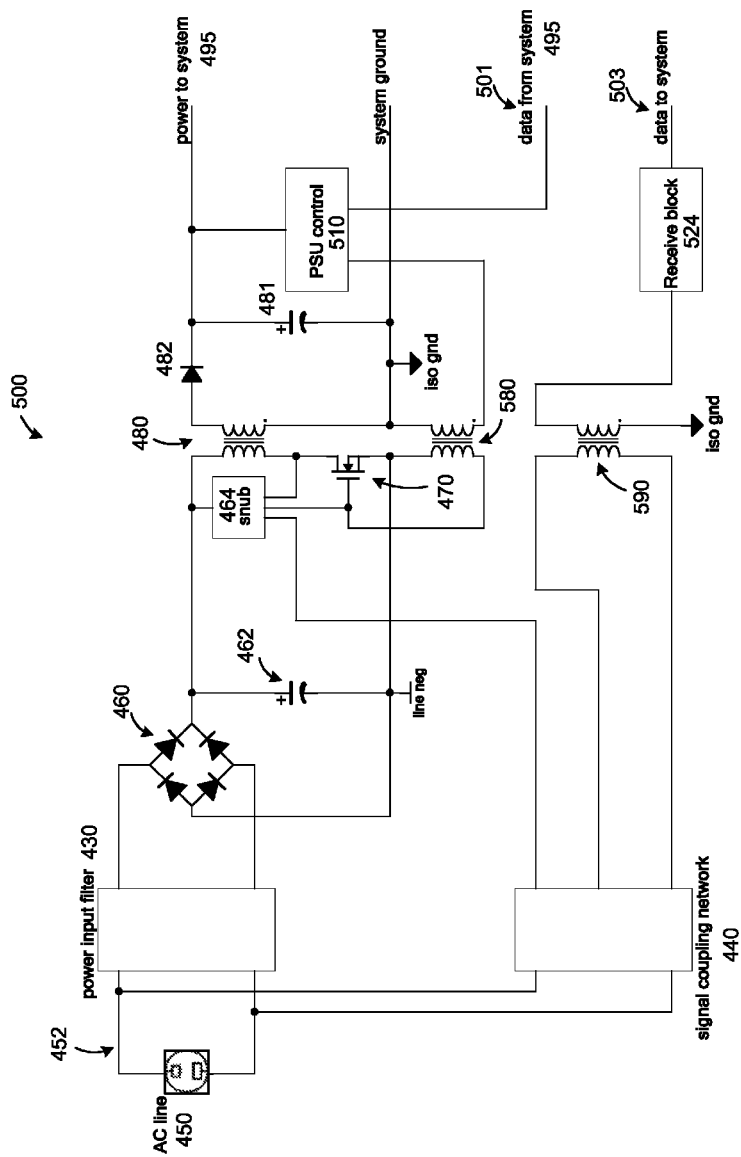
FIG. 5 is a block diagram illustrating a PLC integrated SMPS that is isolated from the AC line according to another embodiment.

FIG. 5 is a block diagram illustrating a PLC-integrated SMPS 500 that is isolated from the AC line according to another embodiment. The PLC-integrated SMPS 500 is similar to the PLC-integrated SMPS 400 as noted by the components with the same reference labels. The PLC-integrated SMPS 500 includes a PSU control block 510 on an load side that is isolated from the AC line 450. When on the isolated load side, for compliance to safety regulations the PLC signals, both outbound and inbound signals, need to be isolated. In addition to the transformer 480, there is a transformer 580 between the PSU control 510 and the transistor 470. Another transformer 590 is located between a receive block 524 and the signal coupling network 440 to isolate the receive block

524. The transformer 580 may be a smaller transformer than transformer 480 and may be dimensioned to handle the relatively low level of signal power at the PLC operating frequency, which is usually between 50 kHz and 150 kHz in this class of equipment. The PSU control 510 can operate similar to the PSU control 510, but controls the power transistor 470 via the transformer 580. The receive block 524 can operate similar to the receive block 424, but receives the PLC communications via the transformer 590.

In one embodiment, an isolation barrier can be used between AC line side and the load side. As described above, transformers can be used as isolation barriers. In another embodiment, information about secondary-side power conditions may be sent across an opto-isolator for the isolation barrier.

Figure 6:
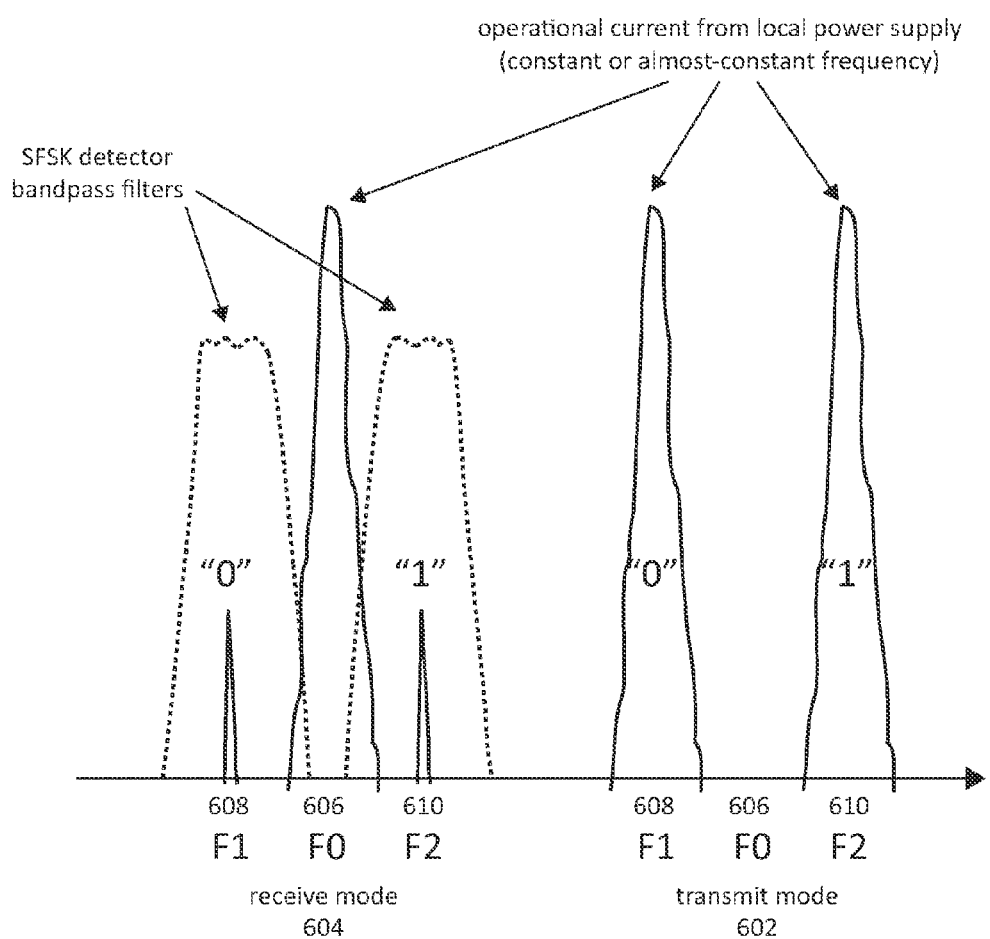
FIG. 6 is a frequency spectrum at the input of a PLC-integrated SMPS using S-FSK in a data-receiving mode and in a data-transmitting mode according to one embodiment.

FIG. 6 is a frequency spectrum 600 at the input of a PLC-integrated SMPS using S-FSK in a data-transmitting mode 602 and a data-receiving mode 604 according to one embodiment. As described above, the PLC-integrated SMPS (400 or 500) is configured to operate at a first frequency (referred to as the idle frequency) F0 606, in a non-communication mode. In a data-transmitting mode 602, the switched-mode PSU is configured to modulate the first frequency 606 between two spread frequencies 608 (F1) and 610 (F2) to transmit data on a power line coupled to the switch-mode PSU. The operational current from the local power supply provides a constant or almost constant frequency F0. In this embodiment, second frequency F1 608 corresponds to a '0' in the data being transmitted and third frequency F2 610 corresponds to a '1' in the data being transmitted. The second frequency F1 608 may be less than the first frequency F0 606 and the third frequency F2 610 may be greater than the first frequency F0 606, or vice versa. In one embodiment, an arithmetic mean of the second frequency F1 608 and the third frequency F2 610 is the first frequency (F0).

In a further embodiment, the switched-mode PSU locks the first frequency F0 606 (idle frequency) to an AC line frequency. In another embodiment, the switched-mode PSU generates a PLC transmit signal when needed to transmit data on the power line. The switched-mode PSU transmits the PLC transmit signal by modulating the first frequency between the different spread frequencies. It should be noted that two spread frequencies are used in the depicted embodiment, but in other embodiments, more spread frequencies may be used. The PLC transmit signal can be transmitted according to a power line transmission standard.

In a further embodiment, the switched-mode PSU includes a receiver (e.g., receiver block 424 or 524) configured to demodulate a power signal between the multiple spread frequencies to receive additional data on the power line in a data-receiving mode 604. In the data-receiving mode 604, the switched-mode PSU may be configured to use an S-FSK detector with bandpass filters 612 to demodulate data from the power signal. The second frequency F1 608 corresponds to a '0' in the data being received and third frequency F2 610 corresponds to a '1' in the data being received. In this way, the S-FSK receiver is configured to detect PLC on the power line.

In one embodiment, the receiver may include a decoder that uses a high-performance analog-to-digital converter (ADC) combined with a pair of bandpass filters with non-overlapping frequency response. In another embodiment, the receiver may treat the S-FSK frequencies (608,610) as images of each other around a local oscillator (first frequency 606), and then use an image-separating mixer that can downmix both S-FSK frequencies to separate intermediate frequency (IF) channels. The IF is the frequency to which the receive signal is mixed down to, prior to filtering and demodulation. This may be effective for the receive because the first frequency F0 606 can be used as the local oscillator frequency. In one embodiment, the Programmable System on a Chip (PSoC®), developed by Cypress Semiconductor, San Jose, Calif. includes a mixer for image-separating digitally in an FSK PLC block. For example, the PSoC®5 system includes various means for implementing this functionality, such a mixer. Alternatively, other circuits may be used to implement the receiver for decoding the data from the power signal as would be appreciated by one of ordinary skill in the art having the benefit of this disclosure.

It should be noted that when equipment is connected to the same power feed, they may all operate either at the same frequency, or at slightly different frequencies over a small frequency interval, perhaps with a small amount of frequency 'dither', to reduce the build-up at one single frequency. Build-up at the single frequency may cause EMC issues with other products.

Figure 7:
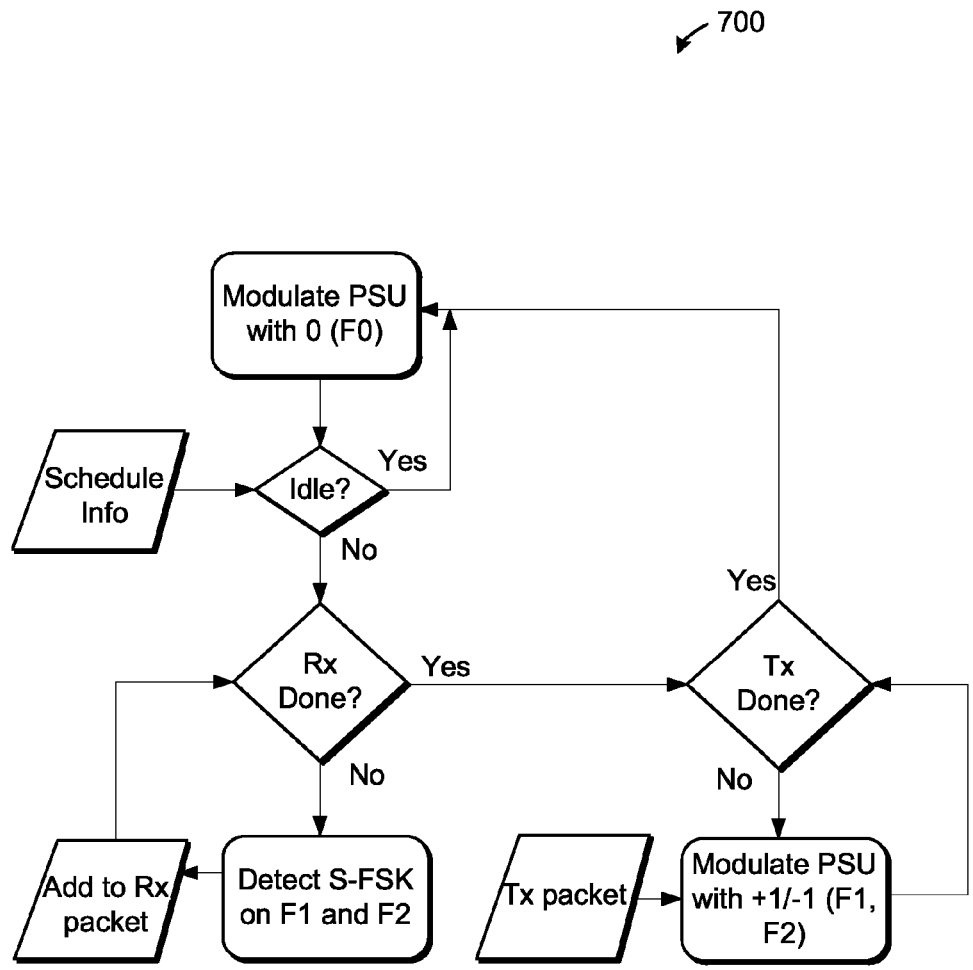
FIG. 7 is a flow diagram of a method of transmitting a packet of data on a power line by modulating a first frequency a PLC-integrated SMPS in a data-transmitting mode according to one embodiment.

FIG. 7 is a flow diagram of a method 700 of transmitting a packet of data on a power line by modulating a first frequency a PLC-integrated SMPS in a data-transmitting mode according to one embodiment. The method 700 may be performed by processing logic that may comprise hardware (circuitry, dedicated logic, etc.), software (such as is run on a general purpose computing system or a dedicated machine), firmware (embedded software), or any combination thereof. In one embodiment, the PSU control 410 of FIG. 4 performs the method 700. In another embodiment, the PSU control 510 of FIG. 5 performs the method 700. Alternatively, other components of the PLC-integrated SMPS performs some or all of the operations of method 700.

Referring to FIG. 7, the method 700 begins with the processing logic modulating the PLC-integrated SMPS with a first value ('0') corresponding to an first frequency F0 (block 702). The processing logic determines if the PLC-integrated SMPS should be idle or not (block 704). If the processing logic determines that the PLC-integrated SMPS should be idle it returns to block 702 to continue modulating with the first value. The processing logic can determine whether the PLC-integrated SMPS should be idle based on schedule information 706. When communication is established between nodes, each node typically transmits and listens according to a schedule that's imposed either by a master unit or by negotiation between nodes. This allows the system to go to sleep, then wake up to communicate with another unit. Alternatively, a continuously powered unit may be able to afford to listen continuously, especially if it does not 'know' when the next relevant packet may arrive. The schedule information 706 may be a scheduled communication event or a triggered communication event. For example, the processing logic may receive the scheduled information along with the data to be transmitted (e.g., one or more transmit packets) from the equipment, such as from a processor or processing element of the equipment. If at block 704 the processing logic determines that the PLC-integrated SMPS is not to be idle, the processing logic determines if the PLC-integrated SMPS is in a data-receiving mode (Rx mode) and determine if the Rx mode is done (block 708). If not, the processing logic detects S-FSK on the second frequency F1 and the third frequency F2 (block 710) to determine whether a '0' is detected (F1) or whether '1' is detected (F2). The processing logic adds the detected bit to a receive packet (block 712) and returns to determine if the Rx mode is done at block 708. When the processing logic determines that the Rx mode is done at block 708, the processing logic determines if the PLC-integrated SMPS is in a data-transmitting mode (Tx mode) and determines if the Tx mode is done (block 714). If the Tx mode is not done at block 714, the processing logic modulates the PLC-integrated SMPS with a second value ('+1') corresponding to the second frequency (F1) or a second value ('−1') corresponding to the third frequency (F2) (block 716). The processing logic receives a Tx packet to be transmitted. The processing logic modulates the first bit initially and then returns to block 714 to determine if the Tx packet has been transmitted. If not, the processing logic modulates the next bit at block 716) and so on until the Tx packet is transmitted and the processing logic determines that the Tx mode is done, returning to block 702.

In another embodiment, the processing logic transmits a transmit packet as data on the power line by modulating the switched-mode PSU with a first value when in the non-communication mode, where the first value corresponds to the first frequency. The processing logic, in the data-transmitting mode, modulates the switched-mode PSU with a second value for 0 bits in the transmit packet and modulates the switched-mode PSU with a third value for 1 bits in the transmit packet.

In another embodiment, when a PLC link is inactive, the power supply idles at frequency F0. When a scheduled or triggered communication event occurs, data may be received on frequencies F1 and F2 without interference in the data-receiving mode. In the data-transmitting mode, the data can be used to modulate the power supply at frequencies F1 and F2 until the packet transmission is over. Then the power supply returns to idling at frequency F0.

Figure 8:
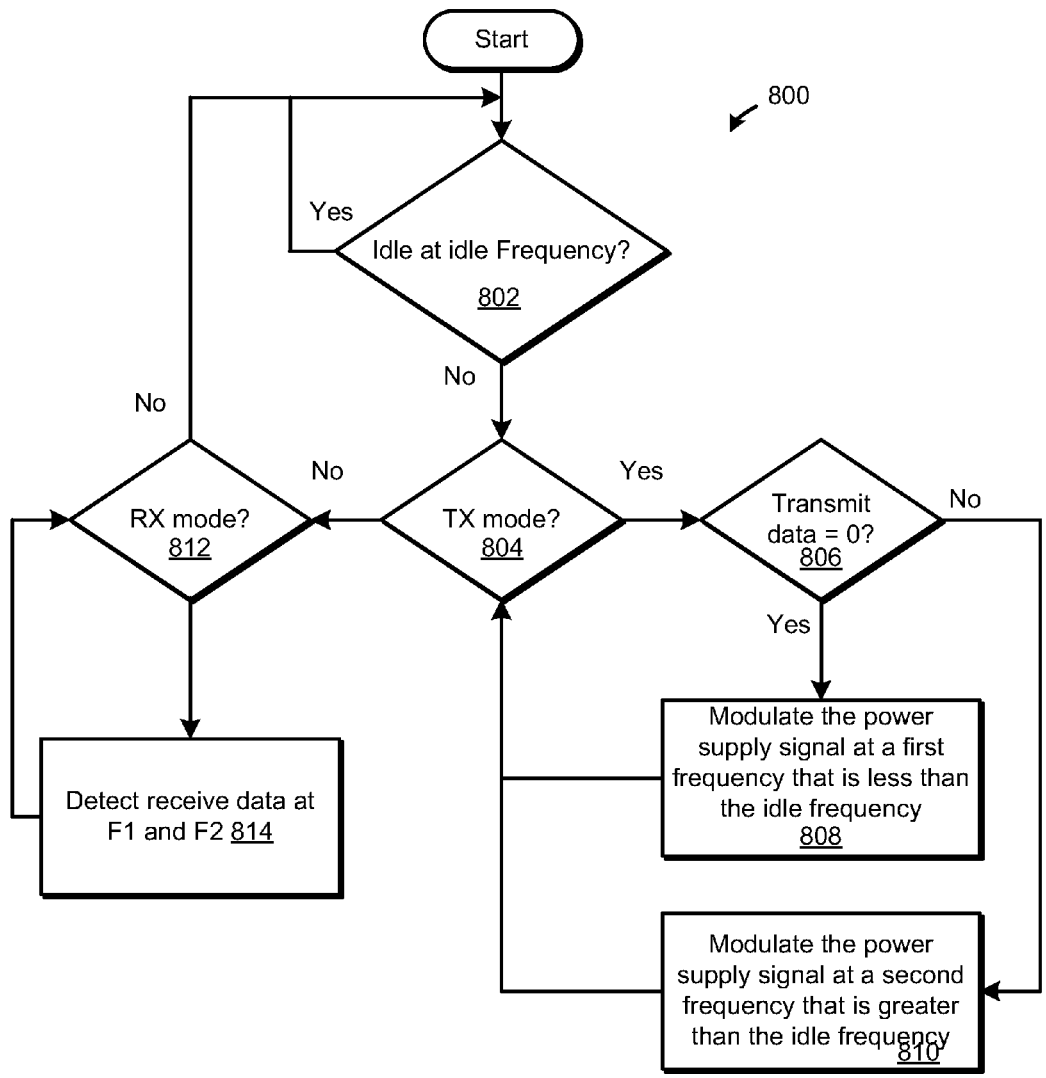
FIG. 8 is a flow diagram of a method 800 of communicating data on a power line using a PLC-integrated SMPS according to one embodiment.

FIG. 8 is a flow diagram of a method 800 of communicating data on a power line using a PLC-integrated SMPS according to one embodiment. The method 800 may be performed by processing logic that may comprise hardware (circuitry, dedicated logic, etc.), software (such as is run on a general purpose computing system or a dedicated machine), firmware (embedded software), or any combination thereof. In one embodiment, the PSU control 410 of FIG. 4 performs the method 800. In another embodiment, the PSU control 510 of FIG. 5 performs the method 800. Alternatively, other components of the PLC-integrated SMPS performs some or all of the operations of method 700.

Referring to FIG. 8, the method 800 begins with the processing logic determining if the PLC-integrated SMPS is to operate a switching frequency of the PLC-integrated SMPS at a first frequency (idle frequency) in a non-communication mode (block 802). The processing logic operates the switching frequency of the PLC-integrated SMPS at the first frequency at block 802 until an event causes the processing logic to determine check if a data-transmitting mode (Tx mode) is triggered (block 804). If a data-transmitting mode is triggered at block 804, the processing logic determines if the data to be transmitted is a '0' (block 806). If so, the processing logic modulates the switching frequency at a second frequency that is less than the first frequency (block 808). If the processing logic determines that a '1' is to be transmitted at block 806, the processing logic modulates the switching frequency at a third frequency that is greater than the first frequency (block 810). In either case, the processing logic determines if more data is to be transmitted at block 804 and repeats until the data has been transmitted in its entirety. When the processing logic determines that the data-transmitting mode is completed or if a data-receiving mode is triggered, the processing logic determines if the PLC-integrated SMPS is to operate in a data-receiving mode (block 812). If so, the processing logic detects data at the first frequency and the third frequency to decode whether the receive data is a '0' or a '1', respectively. When the data-receiving mode is completed, or is not applicable, the processing logic returns to block 802 to operate at the first frequency (idle frequency) in the non-communication mode. Of course, the convention of the bits could be reversed.

The embodiments described herein may be used in various applications. For example, the embodiments of a PLC-integrated SMPS can be used in equipment, such as micro-inverters, small powered equipment that needs PLC, networked light bulbs, or the like. Also, as described above, the PLC-integrated SMPS can be used in a repeater mode to operate as a range-extending repeater in a network of equipment.

Figure 9:
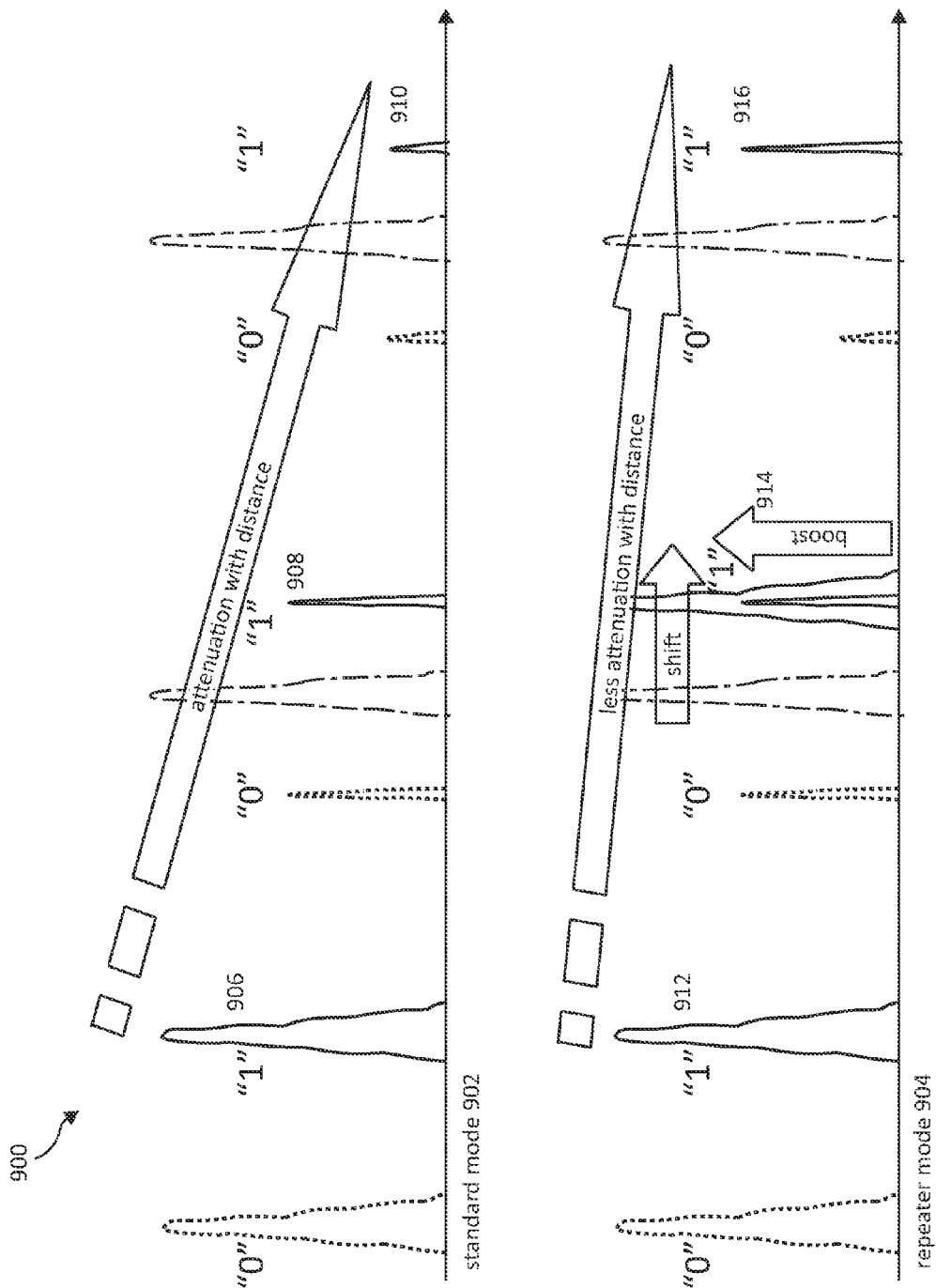
FIG. 9 is a graph of a device operating in a standard mode and in a repeater mode using the PLC-integrated SMPS according to one embodiment.

FIG. 9 is a graph 900 of a device operating in a standard mode 902 and in a repeater mode 904 using the PLC-integrated SMPS according to one embodiment. In this embodiment, the S-FSK receiver is designed to be particularly insensitive to the nominal PSU first frequency of F0 when receiving signals at the second frequency F1 or the third frequency F2. The splitting filter type of S-FSK receiver may also insensitive to F1 when receiving at F2, and vice versa, assuming appropriate design of the filter stopbands. This means that when an incoming signal at F1 is received, it will be permissible for the frequency of the power supply to 'jump' from the default F0 to F1, provided that the receiving node "knows" that the data burst in progress is for rebroadcast and not for local use. While this now completely drowns out the transmitter's signal at F1, it will not degrade the receiver's ability to pick up the transition to F2 that occurs when the transmitter's data changes. At that point, the power supply operating frequency can jump over to F2, and so on. The frequency shift can be used make a repeater, for example to extend a range of transmission between multiple networked devices.

In the standard mode 902, a first device operating a transmitter transmits a '1' 906. The transmission attenuates with distances, as illustrated in the received '1' 908 at a first receiver and the received '1' 910 at a second receiver that is farther away from the transmitter. Similarly, a '0' transmitted by the transmitter attenuates over distance to the first and second receivers.

During the repeater mode 904, using the technique described above, an entire network of devices can 'lock' to an S-FSK transmission, which "ripples out" across the physical network, increasing the modulation levels at F1 and F2 frequencies compared to the static background at ~F0 from the 'idle' power supplies. The intervening device (non-transmitter) can act as a range-extending repeater, enabling communications to be established over a much wider area than is possible through simple reception of the PLC signals from the originating device (transmitter). It also enables significantly lower latency and higher connection utilization than a 'packet re-broadcasting' mechanism would require (in which the node received an entire data packet and subsequently outputs it to the network.

In the repeater mode, the transmitter transmits a '1' 912 and the second receiver receives the '1' and can shift and boost the '1' 914 so that the '1' 916 received at the second receiver is less attenuated than '1' 910 in the standard mode 902.

It should be noted that this positive feedback system has the potential to go wrong if a rogue bit detection occurs, such as under conditions of high external interference. Interlock means may be provided to suppress repeater behavior if network polling protocols indicate that "something is broken," for example. In one embodiment, the system goes back to normal operation and individual units can revert to repeater mode under control of the network's supervisory process. This allows the extended-range network to be rebuilt dynamically. The control unit may usefully retain a map of the expected sensitivities of enumerated nodes so that it can build out the physical network in the most effective way.

More elaborate ways of using the frequency spectrum of the PLC-integrated SMPS may also be envisaged. S-FSK uses two carrier frequencies, but it is possible to use a larger set of carrier frequencies. This also implies a receiver architecture that can track a larger frequency set appropriately. These frequencies could be deployed either simultaneously or sequentially. In the first instance, the carriers may be independently modulated with low bandwidth data using a scheme such as OFDM. In the latter case, the carrier could 'hop' between the frequencies using a 'spreading code' to determine a unique sequence for each individual unit. Depending on the relationship between the hop rate and the data rate, this method could be classified as either FHSS (frequency-hopping spread spectrum, multiple bits per frequency) or DSSS (direct sequence spread spectrum, multiple frequencies per bit).

In some embodiments, the PLC-integrated SMPS can be integrated into a processing device that resides on a common carrier substrate such as, for example, an integrated circuit ("IC") die substrate, a multi-chip module substrate, or the like. In one exemplary embodiment, the processing device is the Programmable System on a Chip (PSoC®) processing device, developed by Cypress Semiconductor Corporation, San Jose, Calif. Alternatively, the processing device may be one or more other processing devices known by those of ordinary skill in the art, such as a microprocessor or central processing unit, a controller, special-purpose processor, digital signal processor ("DSP"), an application specific integrated circuit ("ASIC"), a field programmable gate array ("FPGA"), or the like. Alternatively, descriptions of the PLC-integrated SMPS may be generated and compiled for incorporation into other integrated circuits. For example, behavioral level code describing the PLC-integrated SMPS, or portions thereof, may be generated using a hardware descriptive language, such as VHDL or Verilog, and stored to a machine-accessible medium (e.g., CD-ROM, hard disk, floppy disk, etc.). Furthermore, the behavioral level code can be compiled into register transfer level ("RTL") code, a netlist, or even a circuit layout and stored to a machine-accessible medium. The behavioral level code, the RTL code, the netlist, and the circuit layout may represent various levels of abstraction to describe the PLC-integrated SMPS.

It should be noted that the components of the PLC-integrated SMPS may include all the components described above. Alternatively, the PLC-integrated SMPS may include some of the components described above.

In the above description, numerous details are set forth. It will be apparent, however, to one of ordinary skill in the art having the benefit of this disclosure, that embodiments of the present invention may be practiced without these specific details. In some instances, well-known structures and devices are shown in block diagram form, rather than in detail, in order to avoid obscuring the description.

Some portions of the detailed description are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared and otherwise manipulated. It has proven convenient at times, principally for reasons of common usage, to refer to these signals as bits, values, elements, symbols, characters, terms, numbers or the like.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "encrypting," "decrypting," "storing," "providing," "deriving," "obtaining," "receiving," "authenticating," "deleting," "executing," "requesting," "communicating," or the like, refer to the actions and processes of a computing system, or similar electronic computing device, that manipulates and transforms data represented as physical (e.g., electronic) quantities within the computing system's registers and memories into other data similarly represented as physical quantities within the computing system memories or registers or other such information storage, transmission or display devices.

The words "example" or "exemplary" are used herein to mean serving as an example, instance or illustration. Any aspect or design described herein as "example" or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an embodiment" or "one embodiment" or "an implementation" or "one implementation" throughout is not intended to mean the same embodiment or implementation unless described as such.

Embodiments descried herein may also relate to an apparatus for performing the operations herein. This apparatus may be specially constructed for the required purposes, or it may comprise a general-purpose computer selectively activated or reconfigured by a computer program stored in the computer. Such a computer program may be stored in a non-transitory computer-readable storage medium, such as, but not limited to, any type of disk including floppy disks, optical disks, CD-ROMs and magnetic-optical disks, read-only memories (ROMs), random access memories (RAMs), EPROMs, EEPROMs, magnetic or optical cards, flash memory, or any type of media suitable for storing electronic instructions. The term "computer-readable storage medium" should be taken to include a single medium or multiple media (e.g., a centralized or distributed database and/or associated caches and servers) that store the one or more sets of instructions. The term "computer-readable medium" shall also be taken to include any medium that is capable of storing, encoding or carrying a set of instructions for execution by the machine and that causes the machine to perform any one or more of the methodologies of the present embodiments. The term "computer-readable storage medium" shall accordingly be taken to include, but not be limited to, solid-state memories, optical media, magnetic media, any medium that is capable of storing a set of instructions for execution by the machine and that causes the machine to perform any one or more of the methodologies of the present embodiments.

The algorithms and displays presented herein are not inherently related to any particular computer or other apparatus. Various general-purpose systems may be used with programs in accordance with the teachings herein, or it may prove convenient to construct a more specialized apparatus to perform the required method steps. The required structure for a variety of these systems will appear from the description below. In addition, the present embodiments are not described with reference to any particular programming language. It will be appreciated that a variety of programming languages may be used to implement the teachings of the embodiments as described herein.

The above description sets forth numerous specific details such as examples of specific systems, components, methods and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth above are merely exemplary. Particular implementations may vary from these exemplary details and still be contemplated to be within the scope of the present invention.

It is to be understood that the above description is intended to be illustrative and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. A method comprising:
controlling a switching frequency of a switched-mode power supply unit (PSU) to operate at a first frequency in a non-communication mode; and
modulating the switching frequency of the switched-mode PSU between a plurality of spread frequencies to transmit data on a power line coupled to the switched-mode PSU in a data-transmitting mode, wherein the modulating comprises:
modulating the switched-mode PSU with a first value when in the non-communication mode, wherein the first value corresponds to the first frequency;
modulating the switch-mode PSU with a second value to transmit a 0 bit in the transmit data when in the data-transmitting mode, wherein the second value corresponds to a second frequency of the plurality of spread frequencies; and
modulating the switched-mode PSU with a third value to transmit a 1 bit in the transmit data when in the data-transmitting mode, wherein the third value corresponds to a third frequency of the plurality of spread frequencies.

2. The method of claim 1, wherein the controlling the switched-mode PSU comprises locking the first frequency to an alternating current (AC) line frequency of the power line.

3. The method of claim 1, further comprising generating a power line communication (PLC) transmit signal by the switched-mode PSU to transmit data on the power line.

4. The method of claim 3, further comprising transmitting the PLC transmit signal on the power line by modulating the first frequency between the plurality of spread frequencies, wherein the transmitting the PLC transmit signal comprising transmitting the PLC transmit signal in accordance with a power line transmission standard.

5. The method of claim 1, further comprising demodulating a second power signal between a plurality of spread frequencies to receive additional data on the power line in a data-receiving mode.

6. The method of claim 5, wherein the demodulating comprises de-modulating the switched-mode PSU between the second frequency and the third frequency of the plurality of spread frequencies, wherein the second frequency is less than the first frequency and the third frequency is greater than the first frequency.

7. The method of claim 1, wherein the second frequency is less than the first frequency and the third frequency is greater than the first frequency.

8. The method of claim 7, wherein an arithmetic mean of the second frequency and the third frequency is the first frequency.

9. The method of claim 7, further comprising transmitting a transmit packet as the data on the power line.

10. A method comprising:
controlling a switching frequency of a switched-mode power supply unit (PSU) to operate at a first frequency in a non-communication mode;
modulating the switching frequency of the switched-mode PSU between a plurality of spread frequencies to transmit data on a power line coupled to the switched-mode PSU in a data-transmitting mode, wherein the modulating comprises:
modulating the switched-mode PSU with a first value when in the non-communication mode, wherein the first value corresponds to the first frequency;
modulating the switch-mode PSU with a second value to transmit a 0 bit in the transmit data when in the data-transmitting mode, wherein the second value corresponds to a second frequency of the plurality of spread frequencies; and
modulating the switched-mode PSU with a third value to transmit a 1 bit in the transmit data when in the data-transmitting mode, wherein the third value corresponds to a third frequency of the plurality of spread frequencies;
filtering, by a filter, fundamental and harmonic components of supply switching of the switched-mode PSU when in the non-communication mode; and
controlling leakage between a snubber circuit and a signal coupling network in order to allow a power signal through at a desired signal level when in at least one of a listening mode or a data-receiving mode.

11. An apparatus comprising
a power line communication (PLC) integrated switched-mode power supply (PLC-integrated SMPS) disposed on an integrated circuit (IC) die to be coupled to a power line, wherein the PLC-integrated SMPS comprises
a PSU control block coupled to a power transistor, wherein the PSU control block is configured to control a duty cycle of the power transistor, wherein the PSU control block is configured to control a switching frequency of the PLC-integrated SMPS at a first frequency in a non-communication mode and modulate the switching frequency between a plurality of spread frequencies to transmit data on the power line in a data-transmitting mode, wherein the PSU control block is configured to control the switching frequency of the PLC-integrated SMPS with a first value when in the non-communication mode with a second value to transmit a 0 bit in the transmit data when in the data-transmitting mode and with a third value to transmit a 1 bit in the transmit data when in the data-transmitting mode, wherein the first value corresponds to the first frequency, the second value corresponds to a second frequency of the plurality of spread frequencies and the third value corresponds to a third frequency of the plurality of spread frequencies.

12. The apparatus of claim 11, wherein the PLC-integrated SMPS further comprises a snubber circuit coupled to the PSU control block and the power transistor.

13. The apparatus of claim 11, wherein the PLC-integrated SMPS further comprises a first transformer coupled between the power transistor and the PSU control block.

14. The apparatus of claim 13, wherein the PLC-integrated SMPS further comprises a second transformer coupled between a receive block and the power line.

15. The apparatus of claim 11, wherein the PLC-integrated SMPS further comprises a receive block coupled to the power line to receive additional data on the power line in a data-receiving mode.

16. The apparatus of claim 11, wherein the PLC-integrated SMPS is configured to:
    generate a PLC transmit signal to transmit data on the power line; and
    transmit the PLC transmit signal on the power line by modulating the first frequency between the plurality of spread frequencies.

17. An apparatus comprising:
    a power line communication (PLC) integrated switched-mode power supply (PLC-integrated SMPS) disposed on an integrated circuit (IC) die to be coupled to a power line, wherein the PLC-integrated SMPS comprises:
        a PSU control block coupled to a power transistor, wherein the PSU control block is configured to control a duty cycle of the power transistor, wherein the PSU control block is configured to control a switching frequency of the PLC-integrated SMPS at a first frequency in a non-communication mode and modulate the switching frequency between a plurality of spread frequencies to transmit data on the power line in a data-transmitting mode, wherein the PSU control block is configured to control the switching frequency of the PLC-integrated SMPS with a first value when in the non-communication mode with a second value to transmit a 0 bit in the transmit data when in the data-transmitting mode and with a third value to transmit a 1 bit in the transmit data when in the data-transmitting mode, wherein the first value corresponds to the first frequency, the second value corresponds to a second frequency of the plurality of spread frequencies and the third value corresponds to a third frequency of the plurality of spread frequencies;
        a power input filter coupled between the power line and the power transistor;
        a bridge rectifier coupled between the power input filter and the power transistor; and
        a signal coupling network coupled between the power line and a receive block.

18. A method comprising:
    idling a switched-mode power supply unit (PSU) at a substantially fixed frequency; and
    controlling propagation of switching noise of the switched-mode PSU as a transmitter of signals carrying power line communications on a power line coupled to the switched-mode PSU, wherein the controlling propagation comprises:
        modulating the switched-mode PSU with a first value when idling, wherein the first value corresponds to the substantially fixed frequency;
        modulating the switch-mode PSU with a second value to transmit a 0 bit of the power line communications on the power line wherein the second value corresponds to a second frequency; and
        modulating the switch-mode PSU with a third value to transmit a 1 bit of the power line communications on the power line, wherein the third value corresponds to a third frequency.

19. The method of claim 18, further comprising wherein the substantially fixed frequency is locked to an alternating current (AC) line frequency.

20. The method of claim 18, wherein the controlling the propagation comprises:
    modulating the substantially fixed frequency between the second frequency and third frequency to transmit data for the power line communications on the power line, wherein one of the second frequency and third frequency is higher than the substantially fixed frequency and the second one of the second frequency and third frequency is lower than the substantially fixed frequency; and
    demodulating the substantially fixed frequency between the two different frequencies to receive additional data for the power line communicates on the power line.

* * * * *